United States Patent
Madurawe

(10) Patent No.: US 7,489,164 B2
(45) Date of Patent: Feb. 10, 2009

(54) MULTI-PORT MEMORY DEVICES

(76) Inventor: Raminda Udaya Madurawe, 882 Louise Dr., Sunnyvale, CA (US) 94087

( * ) Notice: Subject to any disclaimer, the term of this patent is extended or adjusted under 35 U.S.C. 154(b) by 0 days.

(21) Appl. No.: 11/986,025

(22) Filed: Nov. 19, 2007

(65) Prior Publication Data

US 2008/0106953 A1 May 8, 2008

(51) Int. Cl.
*G06F 7/38* (2006.01)
*H03K 19/177* (2006.01)

(52) U.S. Cl. .............................. 326/40; 326/37; 326/46

(58) Field of Classification Search .................. 326/40, 326/46; 365/189.04–189.05, 230.05
See application file for complete search history.

(56) References Cited

U.S. PATENT DOCUMENTS

| | | | |
|---|---|---|---|
| 4,609,986 A | 9/1986 | Hartmann et al. | |
| 4,706,216 A | 11/1987 | Carter | |
| 4,761,768 A | 8/1988 | Turner et al. | |
| 4,864,161 A | 9/1989 | Norman et al. | |
| 4,870,302 A | 9/1989 | Freeman | |
| 4,873,459 A | 10/1989 | El Gamal et al. | |
| 5,164,612 A | 11/1992 | Kaplinsky | |
| 5,191,241 A | 3/1993 | McCollum et al. | |
| 5,216,636 A * | 6/1993 | Runaldue | 365/230.05 |
| 5,343,406 A | 8/1994 | Freeman et al. | |
| 5,347,519 A | 9/1994 | Cooke et al. | |
| 5,420,813 A * | 5/1995 | Nii | 365/189.05 |
| 5,488,316 A | 1/1996 | Freeman et al. | |
| 5,563,526 A | 10/1996 | Hastings et al. | |
| 5,581,501 A | 12/1996 | Sansbury et al. | |
| 5,612,631 A | 3/1997 | Agrawal et al. | |
| 5,625,221 A | 4/1997 | Kim et al. | |
| 5,679,967 A | 10/1997 | Janai et al. | |
| 5,684,744 A | 11/1997 | Orgill et al. | |
| 5,701,233 A | 12/1997 | Carson et al. | |
| 5,793,115 A | 8/1998 | Zavracky et al. | |
| 5,835,405 A | 11/1998 | Tsui et al. | |
| 5,844,422 A | 12/1998 | Trimberger et al. | |
| 5,880,598 A | 3/1999 | Duong | |
| 5,943,574 A | 8/1999 | Tehrani et al. | |
| 5,949,710 A | 9/1999 | Pass et al. | |
| 5,949,719 A | 9/1999 | Clinton et al. | |
| 6,005,806 A | 12/1999 | Madurawe et al. | |
| 6,018,476 A | 1/2000 | Madurawe et al. | |
| 6,097,211 A | 8/2000 | Couts-Martin et al. | |
| 6,134,171 A | 10/2000 | Yamagata et al. | |
| 6,134,173 A | 10/2000 | Cliff et al. | |
| 6,151,258 A * | 11/2000 | Sample et al. | 365/189.05 |
| 6,191,614 B1 | 2/2001 | Schultz et al. | |
| 6,242,767 B1 | 6/2001 | How et al. | |
| 6,259,271 B1 | 7/2001 | Couts-Martin et al. | |
| 6,262,596 B1 | 7/2001 | Schultz et al. | |

(Continued)

OTHER PUBLICATIONS

Ashok K. Sharma, "Programmable Logic Handbook—PLDs, CPLDs, & FPGAs", 1998, pp. 99-171, McGraw-Hill, USA, no date.

(Continued)

*Primary Examiner*—Anh Q Tran
(74) *Attorney, Agent, or Firm*—Tran & Associates

(57) ABSTRACT

A semiconductor storage device, comprising: a first port to write data to a storage element; and a second port to read a signal generated by the storage element, wherein reading the generated signal protects data stored at the storage element from a read condition disturbance.

20 Claims, 7 Drawing Sheets

U.S. PATENT DOCUMENTS

| | | | |
|---|---|---|---|
| 6,275,064 B1 | 8/2001 | Agrawal et al. |
| 6,275,065 B1 | 8/2001 | Mendel |
| 6,331,784 B1 | 12/2001 | Mason et al. |
| 6,331,789 B2 | 12/2001 | Or-Bach |
| 6,337,579 B1 | 1/2002 | Mochida |
| 6,340,830 B1 | 1/2002 | Takemura |
| 6,353,562 B2 | 3/2002 | Bohm et al. |
| 6,420,925 B1 | 7/2002 | Fifield et al. |
| 6,426,649 B1 | 7/2002 | Fu et al. |
| 6,448,808 B2 | 9/2002 | Young et al. |
| 6,480,027 B1 | 11/2002 | Ngai et al. |
| 6,496,887 B1 | 12/2002 | Plants |
| 6,504,742 B1 | 1/2003 | Tran et al. |
| 6,515,511 B2 | 2/2003 | Sugibayashi et al. |
| 6,525,953 B1 | 2/2003 | Johnson |
| 6,551,857 B2 | 4/2003 | Leedy |
| 6,582,980 B2 | 6/2003 | Feldman et al. |
| 6,613,611 B1 | 9/2003 | How et al. |
| 6,614,259 B2 | 9/2003 | Couts-Martin et al. |
| 6,627,985 B2 | 9/2003 | Huppenthal et al. |
| 6,737,675 B2 | 5/2004 | Patel et al. |
| 6,738,962 B1 | 5/2004 | Flaherty et al. |
| 6,798,240 B1 | 9/2004 | Pedersen |
| 6,812,731 B1 | 11/2004 | Trimbrger |
| 6,911,730 B1 | 6/2005 | New |
| 6,946,330 B2 | 9/2005 | Yamazaki et al. |
| 6,954,084 B2 | 10/2005 | Islam |
| 6,992,503 B2 | 1/2006 | Madurawe |
| 6,998,722 B2 | 2/2006 | Madurawe |
| 7,019,557 B2 | 3/2006 | Madurawe |
| 7,030,651 B2 | 4/2006 | Madurawe |
| 7,064,018 B2 | 6/2006 | Madurawe |
| 7,064,579 B2 | 6/2006 | Madurawe |
| 7,084,666 B2 | 8/2006 | Madurawe |
| 7,112,994 B2 | 9/2006 | Madurawe |
| 7,176,713 B2 | 2/2007 | Madurawe |
| 7,253,659 B2 | 8/2007 | Madurawe |
| 7,268,580 B2 | 9/2007 | Madurawe |
| 2001/0003428 A1 | 6/2001 | Or-Bach |
| 2001/0019155 A1 | 9/2001 | Warashina et al. |
| 2001/0028059 A1 | 10/2001 | Emma et al. |
| 2001/0047509 A1 | 11/2001 | Mason et al. |
| 2002/0177260 A1 | 11/2002 | Matsumoto |
| 2002/0186044 A1 | 12/2002 | Agrawal et al. |
| 2003/0001615 A1 | 1/2003 | Sueyoshi et al. |
| 2003/0023762 A1 | 1/2003 | Dhir et al. |
| 2003/0085733 A1 | 5/2003 | Pugh et al. |
| 2003/0227056 A1 | 12/2003 | Wang et al. |
| 2005/0023656 A1 | 2/2005 | Leedy |

OTHER PUBLICATIONS

Alexander, et al., "Three-Dimensional Field-Programmable Gate Arrays", Proceedings of the 8$^{th}$ Annual IEEE International ASIC Conference and Exhibit, 1995, pp. 253-256, no date.

Ashok K. Sharma, "Programmable Logic Handbook—PLDs, CPLDs, & FPGAs", 1998, pp. 99-171, McGraw-Hill, USA.

Alexander, et al., "Three-Dimensional Field-Programmable Gate Arrays", Proceedings of the 8$^{th}$ Annual IEEE International ASIC Conference and Exhibit, 1995, pp. 253-256.

* cited by examiner

MULTI-PORT MEMORY DEVICES

BACKGROUND

The present invention relates to multi-ported memory devices, device layouts and processes for fabricating such devices.

Development of semiconductor memory devices has been increasing at a fast pace in recent times because of major breakthroughs in materials, manufacturing processes and designs of semiconductor devices. Semiconductor device manufacturers are constantly enhancing their efforts for more advanced miniaturization, high-integration and capacity increase of the semiconductor devices. As discussed in commonly owned U.S. Pat. NoS. 7,285,982; 7,285,981; 7,268,580; 6,998,722; 6,856,030; 6,849,958; and 6,828,689, all invented by the inventor of the present invention, the content of which is incorporated by reference, a latch is a data storage unit in a semiconductor device comprising of two inverters. An inverter has an input and an output having a voltage of opposite polarity to said input. The inverter is connected between a system power voltage level and system ground voltage level. Two such inverters connected back-to-back have self sustaining voltages at their inputs and outputs. A static random access memory (SRAM) device is a type of semiconductor memory device that has low power consumption and fast access time relative to a dynamic random access memory (DRAM) device. An SRAM cell comprises a latch and one or more access devices. The latch stores binary data, and the access device provides the capability to read and write data into the latch. Multiple access devices provide multiple access paths to read and write the single latch data.

One advance in the field of SRAM devices has been the development of a dual port SRAM capable of performing a read and write operation at high speeds in place of the conventional single port SRAM. In general, one unit memory cell of a single port SRAM device is composed of six transistors, that is, two load transistors, two drive transistors and two active transistors, to perform the read and write operations sequentially. In contrast, a dual port SRAM device is configured with an addition of two active transistors to the general single port SRAM so as to perform the read and write operations in a dual mode, and which is required to obtain a very high speed operation. However, the dual port SRAM's shortcoming is that the read and write operations interfere with each other to cause a characteristic drop in the semiconductor memory cell since the read and write operations are performed simultaneously.

As discussed in US Application 20050047256, the content of which is incorporated by reference, FIG. 1 shows a prior art dual port SRAM cell composed of two load transistors: TL1 and TL2, two drive transistors: TD1 and TD2 and four active transistors: TA1, TA2, TA3 and TA4. First and second load transistors: TL1 and TL2, and first and second drive transistors: TD1 and TD2, are individually connected to form two inverters. The two inverters are cross coupled to create a latch for storing data. A first active transistor TA1 is connected to a read bit line BLR, and a third active transistor TA3 is connected to a write bit line BLW that is positioned adjacently to the read bit line BLR. As TA1 and TA3 access the same node of the latch 10, both BLR and BLW (12) can read or write data. Transistors TL1, TL2, TD1, TD2, TA1, TA2, TA3 and TA4 are appropriately sized to make the read and write states perform properly. SRAM used for Cache memory typically has multiple read and write ports.

A second active transistor TA2 is connected to a complementary read bit line !BLR, and a fourth active transistor TA4 is connected to a complementary write bit line !BLW that is arranged adjacent to the complementary read bit line !BLR. Further, a read word line WLR is shared with the first active transistor TA1 that is connected to the read bit line BLR, and with the second active transistor TA2 connected to the complementary read bit line !BLR. A write word line WLW is shared with the third active transistor TA3 connected to the write bit line BLW and with the fourth active transistor TA4 connected to the complementary write bit line !BLW. Complementary bit lines and word lines offer higher operating margins for the latch 10. FIG. 2A shows a generic representation of prior art multi-port memory cells. Memory cell in FIG. 2A, includes a storage unit (SU) 20. The SU may or may not be coupled to power Vcc and ground Vss. Access devices 21, 23, 25 and 27 couple one or more nodes of the SU 20 to bit-lines and word-lines as shown. The configurable element in SU 20 may be a latch, Flash element, DRAM element, EPROM element, EEPROM element, or any other property changeable element. FIG. 2B shows the SRAM implementation, while FIG. 2B shows a Flash implementation of SU 20. In FIG. 2B, the memory cells are selected by a plurality of world lines WL1 and WL2 as well as bit lines BL1 and BL2 and their complementary bit lines !BL1 and !BL2 (!BL denotes NOT bit-line). Pass transistors 102 and 106 are controlled by WL2, while pass transistors 112 and 116 are controlled by WL1. Pass transistor 102 is connected between inverter 104 and !BL2, while pass transistor 106 is connected between inverter 104 and BL2. Correspondingly, pass transistor 112 is connected between inverter 114 and !BL1, while pass transistor 116 is connected between inverter 114 and VBL1. In FIG. 2, the inverter may have a PMOS pull-up device (in which case the memory cell is equivalent to FIG. 1), a Resistor-load, or a Thin-Film PMOS transistor. In FIG. 2, one or both inverters 104, 114 may comprise a thin-film inverter. Similarly, one or more transistors 102, 106, 112, 116 may also comprise transistors constructed on a substrate layer, or a thin-film semiconductor layer.

FIG. 2C shows a floating gate (EEPROM) memory cell. In the SU 20, a floating gate 111 is coupled to a write access device 107 via a tunneling diode 109. Access device 107 couples the tunneling node 109 to write word line WLw and write bit line BLw. Orthogonality ensures individual bit access in an array of bits. Charge is injected to floating gate 111 to program or erase the cell: negative charge programs the bit to off state, positive charge erases the bit to on state. A read word line WLr is capacitively coupled to floating gate 111 at by capacitor 117, and a floating gate pass-transistor 115 is coupled between read bit line pair $BLr_1$ and $BLr_2$. Thus activating WLr enables to read the state of bit thru BLr pair: a conductive state and a no-conductive state. Typical EEPROM's have a single write port and a single read port. Transistor sizing and material thicknesses are carefully balanced to write data during write mode and not to disturb the floating gate during a read mode.

SUMMARY

In one aspect, a semiconductor storage device includes a storage element to store a data state; first and second access circuits coupled to the storage element; a first access device coupled to the storage element and further coupled to the first access circuit to read or alter the stored data state; an isolation circuit coupled to the storage element comprising an output derived by the stored data state; and a second access device coupled to the output and further coupled to the second access circuit to read the output state, wherein the isolation circuit prevents the second access circuit alter the data state.

In another aspect, a three-dimensional semiconductor device includes a latch to store a data state; an isolation circuit coupled to the latch; and an access device coupled to the isolation circuit and further coupled to an evaluation circuit, wherein the latch data is fully isolated from the evaluation circuit.

In another aspect, a method for programming a memory cell, the method comprising: providing a memory circuit comprised of: a storage circuit having a storage node coupled to an access device and an isolation circuit, the isolation circuit having an output node; and applying a voltage through said access device to alter a data state on said storage node and determining from a signal on said output node when the storage node data state is altered.

In another aspect, a method of forming a semiconductor memory cell, the method comprising: forming a metal layer having a plurality of geometries; forming a memory cell above the metal layer having a storage node coupled to an access device and an isolation circuit, the isolation circuit having an output node coupled to a said metal geometry.

In yet another aspect, a semiconductor storage device includes a first port to write data to a storage element; and a second port to read a signal generated by the storage element, wherein reading the generated signal prevents the storage element from being disturbed by the read operation.

Advantages of the IC may include one or more of the following. The IC may be constructed as a 3D IC. In a first embodiment, the memory cell in a first die element may be coupled to logic circuits in a second die element above or below the first die element. In a second embodiment the memory cell may be positioned above logic circuits in a monolithic IC construction. In a third embodiment the multi-port memory cell may be insensitive to large variations in device properties incurred at manufacturing. A preferred embodiment of the present invention is constructed with thin-film transistor technology and the multi-ported semiconductor memory device is invariant to variations in thin film electrical characteristics more prevalent over bulk CMOS characteristics. The memory cell may be used in configuration circuits for programmable logic devices. The device has reduced power consumption as well as reduced chip area requirement due to its 3D fabrication, the memory located vertically on top or bottom of the chip. Thus the chip area occupied by the memory is considerably reduced compared to the conventional 2D dual-port semiconductor memory device which is placed in a planar manner with other electronic modules such as programmable elements in field programmable gate array (FPGA) devices. In addition, the system can perform high speed global erase/clear operations as well as concurrent write and read operations. Such high speed reading in parallel with writing operations allows verification to be done in parallel so that the overall writing time is reduced. In the FPGA application, the FPGA device can be configured much faster than conventional FPGA devices. In preferred embodiment, metal layers located underneath the memory cell may be used as local interconnect to couple a first node in the cell to a second node in the cell.

Advantages of the dual-port memory cell may further include a first storage unit powered by a first set of supply voltages, and a second isolation circuit powered by a second set of supply voltages to allow voltage scalability. The memory cell may have a first plurality of access devices to read and write data to the cell. The memory cell may further have a second plurality of access devices only to read data from the cell with no possibility of altering the data state. The cell may have a node driven by a power supply voltage that can drive a control signal.

When used in an FPGA product, other advantages of the disclosed memory cells may include one or more of the following. An easy turnkey customization of an ASIC from an original smaller PLD or FPGA would greatly enhance time to market, performance, low cost and better reliability. A series product families can be provided with a modularized programmable element in an FPGA version followed by a turn-key custom ASIC with the same base die with 1-2 custom masks. The vertically integrated programmable module does not consume valuable silicon real estate of a base die. Furthermore, the design and layout of these product families adhere to removable module concept: ensuring the functionality and timing of the product in its FPGA and ASIC canonicals. These IC products can replace existing PLD and FPGA products and compete with existing Gate Arrays and ASIC's in cost and performance.

Other advantages and features of embodiments of the present invention will be apparent from the following detailed description when read in conjunction with the accompanying drawings.

DESCRIPTION

The terms wafer and substrate used in the following description include any structure having an exposed surface with which to form the latch structure of the invention. The term substrate is understood to include semiconductor wafers. The term substrate is also used to refer to semiconductor structures during processing, and may include other layers that have been fabricated thereupon. The term layer is used for processing steps used in the manufacturing process. The term layer also includes each of the masking layers of the process. Both wafer and substrate include doped and undoped semiconductors, epitaxial semiconductor layers supported by a base semiconductor or insulator, SOI material as well as other semiconductor structures well known to one skilled in the art. The term conductor is understood to include semiconductors, and the term insulator is defined to include any material that is less electrically conductive than the materials referred to as conductors. The term conducting path defines conductors and semiconductors connected in series. A conducting path includes multiple semiconductor regions having different dopant levels. A conducting path may be conductive or non-conductive based on the semiconductor properties in the conducting path. The conductivity of a semiconductor is dependent on the mobility of electrons and holes in said conducting path. The term strong device is used to identify a device with electron and hole mobility similar to single crystal level of semiconductor quality. A weak device include a device having electron and hole mobility below that achieved in single crystal quality semiconductor with equivalent doping. The term geometry is used to define an isolated pattern of a masking layer. Thus one mask layer is a collection of geometries in that mask pattern. The term module includes a structure that is fabricated using a series of predetermined process steps. The boundary of the structure is defined by a first step, one or more intermediate steps, and a final step. The resulting structure is formed on a substrate. The following detailed description is, therefore, not to be taken in a limiting sense.

Figure 1:
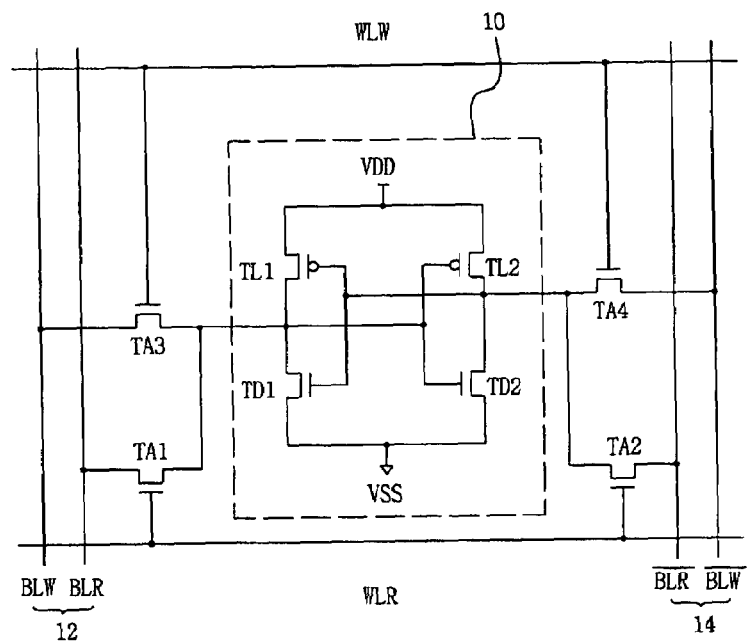
FIG. 1—shows prior art multi-ported SRAM memory device.
Figure 2A:
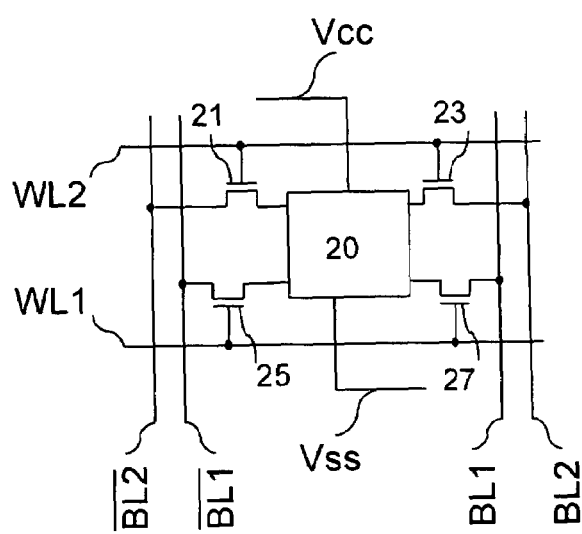
FIG. 2A shows a multi-port storage element block-diagram.
Figure 2B:
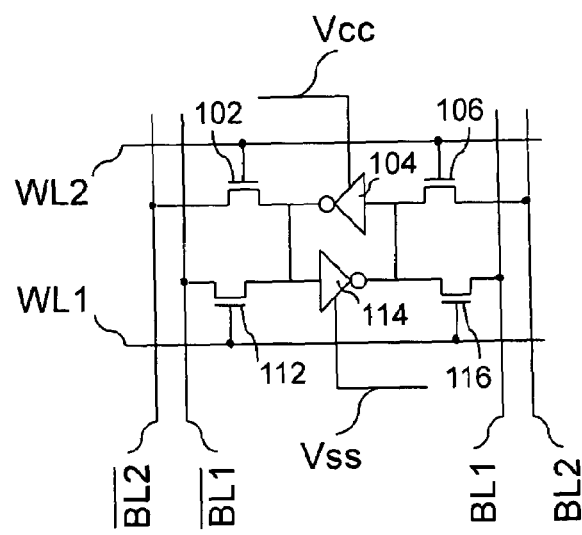
FIGS. 2B & 2C show cross-coupled latch & floating gate storage elements.
Figure 2C:
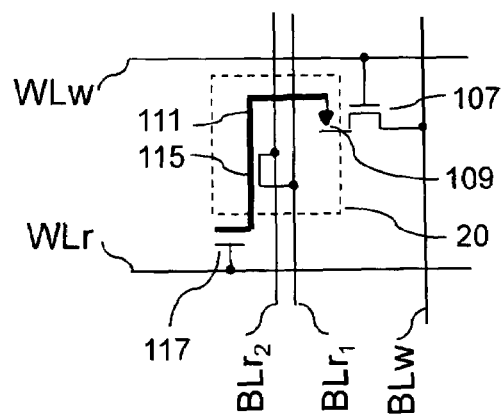
Figure 3:
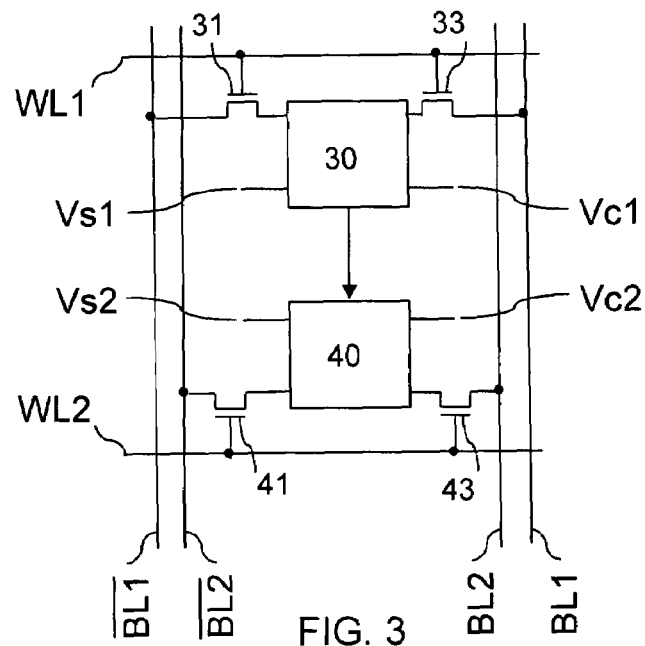
FIG. 3 shows an embodiment of a multi-ported memory cell.

FIG. 3 shows a block diagram of a memory cell adapted to read and write data, both operations having a very wide operating margin. The memory cell has a storage unit (SU) 30 comprising one or more configurable elements. Transistors 31 and 33 couple SU 30 to word line WL1 and bit lines BL1, !BL1, facilitating data write and/or data read of storage unit. An isolation unit (IU) 40 is coupled to SU 30. One or more data signals of SU 30 are received as inputs to IU 40, and one or more outputs are generated by IU 40. Access devices 41 and 43 couple the outputs of IU 40 to word line WL2 and bit lines BL2, !BL2, facilitating data read of the output. SU 30 may be powered by Vc1 and Vs1 voltages, while IU 40 may be powered by Vc2 and Vs2 voltages. Vc1 and Vc2 may be a common power supply voltage, while Vs1 and Vs2 may be a common ground supply voltages. Vc1 and Vc2 may be at different supply voltage levels. IU 40 isolates the data state stored in SU 30 from read voltages applied at BL2 and !BL2, thus preventing accidental change to stored data. Such an arrangement has the many advantages such as: not requiring SU 30 device sizing to prevent read disturbs, ability to concurrently read IU 40 during write of SU 20, using Vc2 and Vs2 voltages and IU 50 device sizing to drive BL2, !BL2 capacitance, use resistor ratio circuits that are easy to fabricate in 3D, and tolerate large threshold voltage and on current variations within SU and IU circuit elements.

Figure 4A:
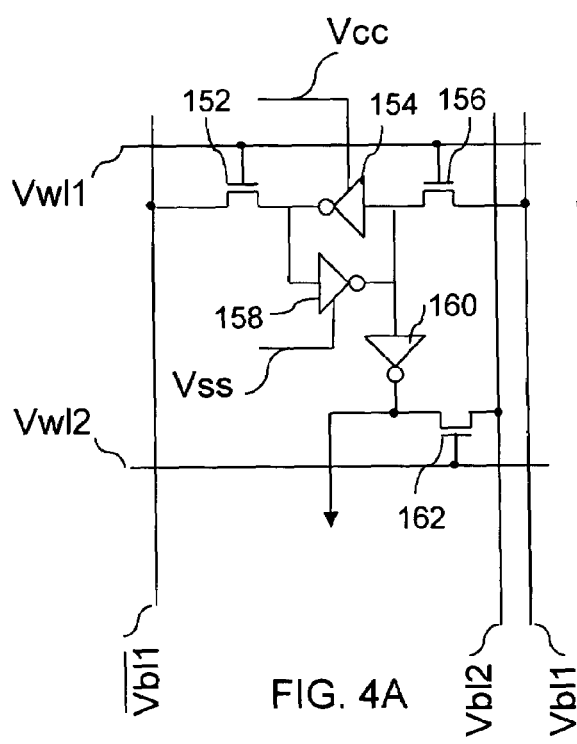
FIG. 4A shows a first embodiment of a multi-ported memory cell.

Turning now to FIG. 4A, a first embodiment of a multi-ported memory cell is shown. The shown memory cell is a latch formed using back-to-back coupled inverters 154 and 158. The latch may be any data storage element such as a non-volatile memory element, a DRAM element, a flash memory element or a property changing element. The data in the latch may be changed a plurality of times via access devices. A latch in a latch array is selected by a plurality of world lines VLW1 and VWL2 as well as a plurality of bit lines VBL1 and VBL2 and complementary bit line !VBL1. Complimentary bit lines enhance the capability of writing data to the latch through a common word line. Pass transistors 152 and 156 are controlled by a first word line VWL1, while pass transistor 162 is controlled by a second word line VWL2. Pass transistor 152 is connected between the output of inverter 154 and !VBL1, and pass transistor 156 is connected between the output of inverter 158 and VBL1. Inverter 158 drives inverters 154 of the latch and inverter 160. Thus the data stored in latch generates an output from inverter 160. The output of inverter 160 is gated by pass transistor 162 that connects inverter 160 and VBL2.

The memory cell of FIG. 4A includes a storage unit such as the latch formed by inverters 154 and 158 to store a data state; first and second access circuits such as write lines and bit lines VWL1, VWL2, VBL1, VBL2 connected to the storage element; a first access device such as pass transistor 156 connected to the storage element and to the first access circuit to read or alter the stored data state; an isolation circuit such as inverter 160 connected to the storage element comprising an output derived by the stored data state; and a second access device such as pass transistor 162 connected to the output and to the second access circuit to read the output state, wherein the isolation circuit such as inverter 160 prevents the second access circuit from altering the data state. One embodiment of FIG. 4A may use PMOS and NMOS transistors to implement inverter 160. The latch may be constructed with R-load inverters or TFT devices.

Figure 4B:
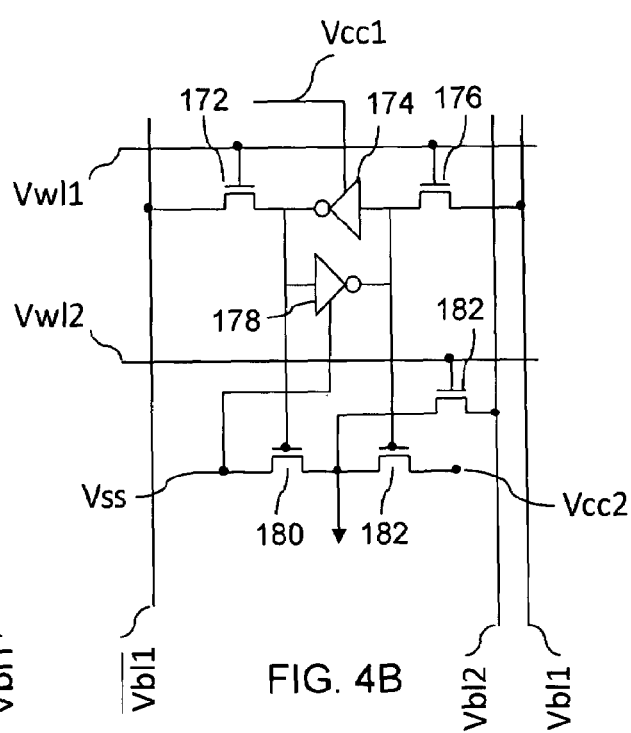
FIG. 4B shows a second embodiment of a multi-ported memory cell.

Referring now to FIG. 4B, a second embodiment of a multi-ported memory cell is shown. The embodiment of FIG. 4B has two NMOS transistors to implement an equivalent of inverter 160 isolation circuit in FIG. 4A. The two transistors allow a voltage scaling circuit such that a Vcc2 is used to derive the output signal. The storage unit is capacitively coupled to the isolation unit to prevent data disturb during read conditions.

Turning now to FIG. 4B, the memory cells are selected by a plurality of world lines VLW1 and VWL2 as well as bit lines VBL1 and VBL2 and their complementary or inverted versions !VBL1 and !VBL2. Pass transistors 172 and 176 are controlled by VLW1, while pass transistor 184 is controlled by VLW2. Pass transistor 172 is connected between inverter 174 and !VBL1. The output of inverter 174 drives the gate of pass transistor 180 as well as the input of inverter 178. Pass transistor 176 is connected between the input of inverter 174 and VBL1. Pass transistor 184 is controlled by VWL2 and is connected to a common node between pass transistors 180 and 182 which are NMOS transistors. One end of pass transistor 180 is grounded, while the remaining end of transistor 182 is connected to VCC.

Figure 4C:
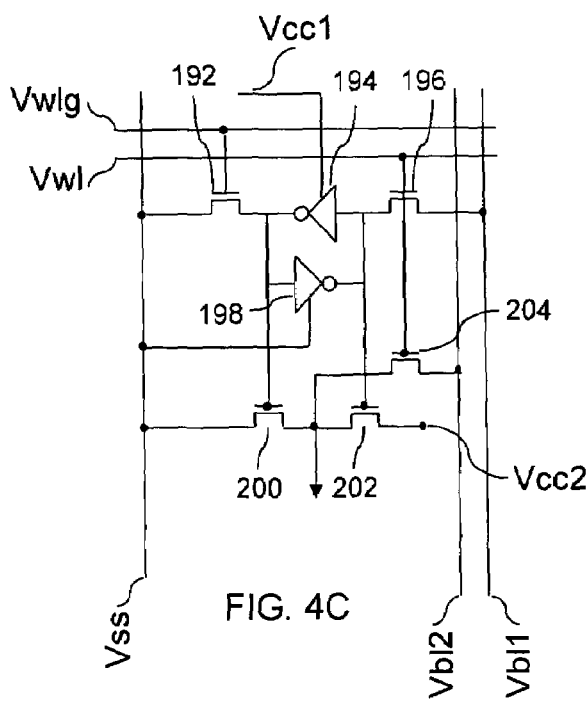
FIG. 4C shows a third embodiment of a multi-ported memory cell.

Turning now to FIG. 4C, a third embodiment of a multi-ported memory cell is shown. This embodiment can perform a global reset (or global clear) of all memory cell contents through control line VWLG. Signal lines VWLG and Vss are common to all the bits—thus one end of latch (comprising inverters 194 & 198) is forced to ground during global reset. The embodiment allows individual bits to be selectively turned on to be set on a row-by-row fashion. Selecting word line VWL selects all bits in that row—appropriately selecting data states 0's and 1's on all VBL1 lines, the select bits are altered from the global reset state to opposite state. Further, the dual ported nature of the memory cell allows the read after write verification to be done quickly and allows the next row to be programmed quickly without waiting for a worst case timing to ensure all memory cells have been written correctly.

The memory cells are selected by a plurality of world lines VWL and VWLG as well as bit lines VBL1 and VBL2. Pass transistor 192 is connected between inverters 194 and 198 and VSS. Pass transistor 192 is controlled by VWLG for performing a global reset, while pass transistor 196 is controlled by VWL. When VWLG is asserted, the input to inverter 198 is grounded and the latch comprising inverters 194 and 198 store a logic zero.

One end of pass transistor 196 is connected to VBL1 which acts as a write input. The output of inverter 194 drives the gate of pass transistor 200. Pass transistor 204, controlled by VWL, provides an output on VBL2 in response to a read request and has one end that is connected to a common node that is connected to the pass transistors 180 and 182 and the other end connected to VBL2. One end of pass transistor 200 is grounded, while the remaining end of transistor 202 is connected to VCC. During a read, the output of the latch drives the gate of pass transistor 202 and allows an isolated read to be done and this isolated read does not disturb the content of the memory cell and thus read and write can be performed in parallel.

Figure 5:
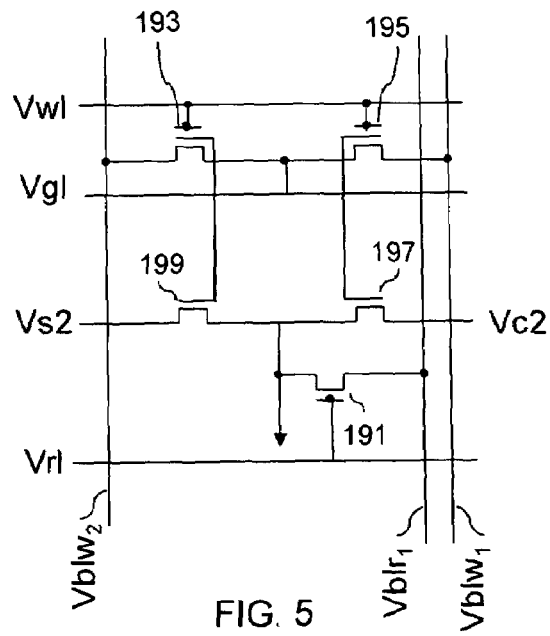
FIG. 5 shows a floating-gate embodiment of a multi-ported memory cell.

FIG. 5 is another embodiment of the read port memory cell implemented with floating gate technology. In FIG. 5, devices 193 and 195 are Flash memory cells, each having a floating gate. The control gates are coupled to word line Vw1, and the common source is coupled to Vg1. The read/write bit lines are shown as Vblw$_1$ and Vblw$_2$. Applying a high Vw1 (all word lines together or one by one), grounding common Vg1 allows a global reset of all bits. All floating gates get negatively charged. The floating gates of flash bits 193 and 195 are coupled to gates of transistors 199 and 197 respectively as shown. All floating gate transistors 197 & 199 are off. Applying a high voltage on select Vw1, a mid voltage on unselected Vw1, ground on select Vw1 and a mid voltage on unselected Vw1, allows the selected bits on a word line to program. Then one of the floating gates of 193, 195 pair gets positively charged. One of the floating gates is charged to off state (negative electrons) and one of the floating gates is charge to on state (positive holes). The bit state is altered by switching which the floating gate charges. One of the two pass gates in the isolation circuit is on, thus coupling Vc2 or Vs2 to the read select device 191. Read select device 191 is coupled to read word line Vr1 and read bit line Vblr$_1$. Thus when the bit is programmed, the read device signals the end of programming cycle.

Figure 6:
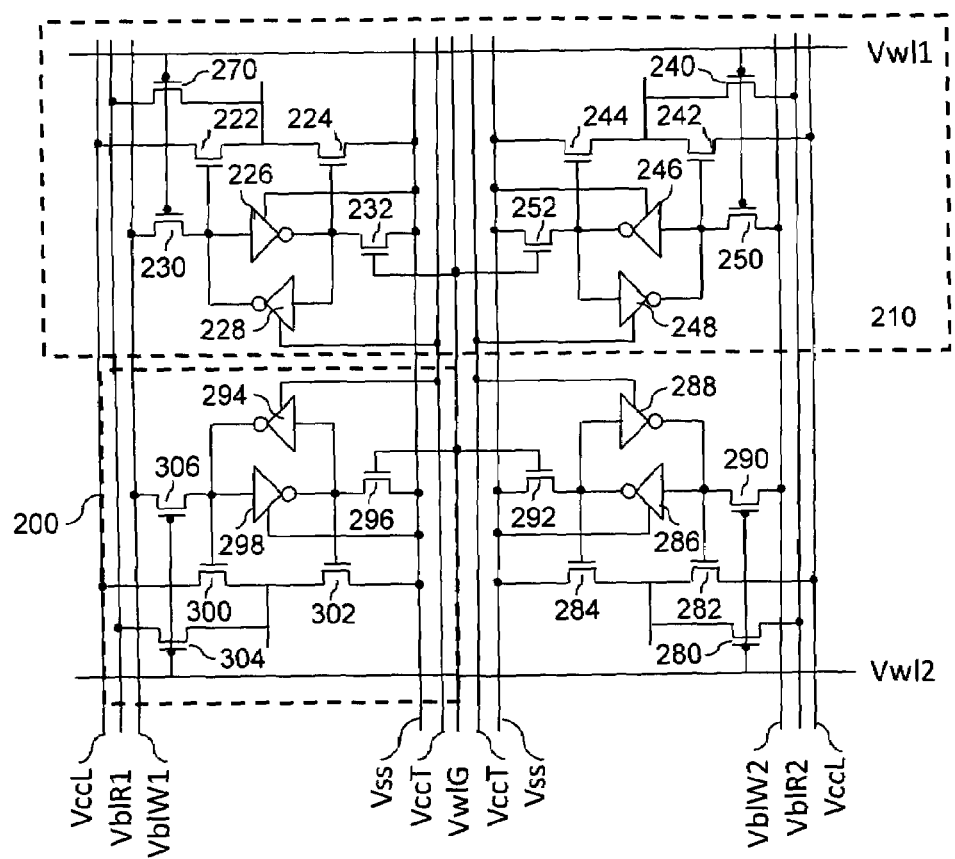
FIG. 6 shows a fourth embodiment of a multi-ported memory cell.

Referring now to FIG. 6, a fourth embodiment of a multi-ported memory cell is shown. This embodiment provides four identical memory cells, and hence only the memory cell 200 of the bottom left quadrant of FIG. 6 will be discussed. The operation of the remaining three cells is identical and thus for clarity they will not be discussed. In FIG. 6, pass transistor 296 is connected between inverters 294 and 298 and VSS. Pass transistor 296 is controlled by VWLG for performing a global reset, while pass transistor 306 is controlled by VWL. When VWLG is asserted, the input to inverter 294 is grounded and the latch comprising inverters 294 and 298 store a logic zero. The output of inverter 298 set to zero drives the gate of 302.

One end of pass transistor 306 is connected to VBL1 which acts as a write input. The output of inverter 294 drives the gate of pass transistor 300. Selecting pass-transistor 306, the latch state can be altered from the global reset state by appropriate bias at VBL1. Transistor pair 300 & 302 act as isolation circuit for latch data, generating a derived signal which is coupled to Vss or VccT. Pass transistor 304, also controlled by VWL (in other embodiments, the read word line is not shared with the write word line) provides an output on VBL2 in response to a read request. The generated signal is driven by the common node that is connected to the pass transistors 300 and 302; which in turn is coupled to Vss or VccT. Thus Vss or VccT drives the Vblr1 to a read state. One end of pass transistor 300 is grounded, while the remaining end of transistor 302 is connected to VCCT. During a read, the output of the latch drives the gate of pass transistor 302 and allows an isolated read to be done and this isolated read does not disturb the content of the memory cell and thus read and write can be performed in parallel.

Figure 7:
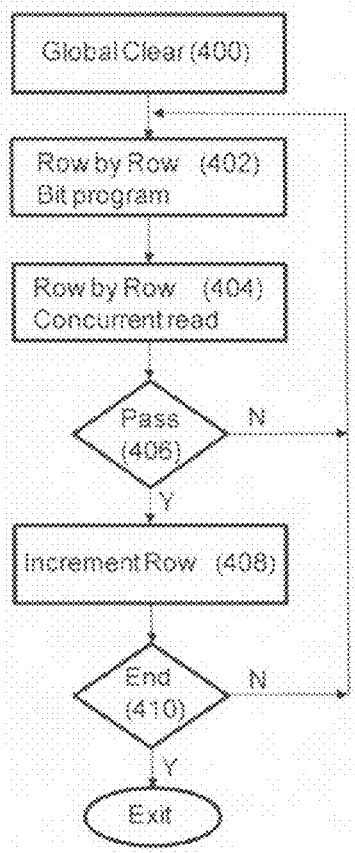
FIG. 7 shows an exemplary process for using the multi-ported memory devices of FIGS. 3-6 for high performance write operations with verification.

FIG. 7 shows an exemplary erase / program process for using multi-ported memory devices of FIGS. 3-6 for high performance write with verification. In this process, a global reset (global clear) to clear all memory content is done (400). Next, the first row is selected. This row is incremented as the cycle continues. For the selected row, particular bits of the row are set to one (flipped bits) during a write operation (402) via a write port. Concurrently, the programmed values are read from the multi-ported memory cells (404) via a read port that does not interfere with the write operation. The content is verified (406) with correct data state. If the write operation fails, the process holds the programming step or repeats the programming step on the selected row (loops back to 402). If the write operation is successful, the process increments a row counter to program the next row (408). The process then checks to see if all rows have been programmed (410). If not, the process loops back to 402 to program the next row of memory. Alternatively, if done, the process exits.

Figure 8:
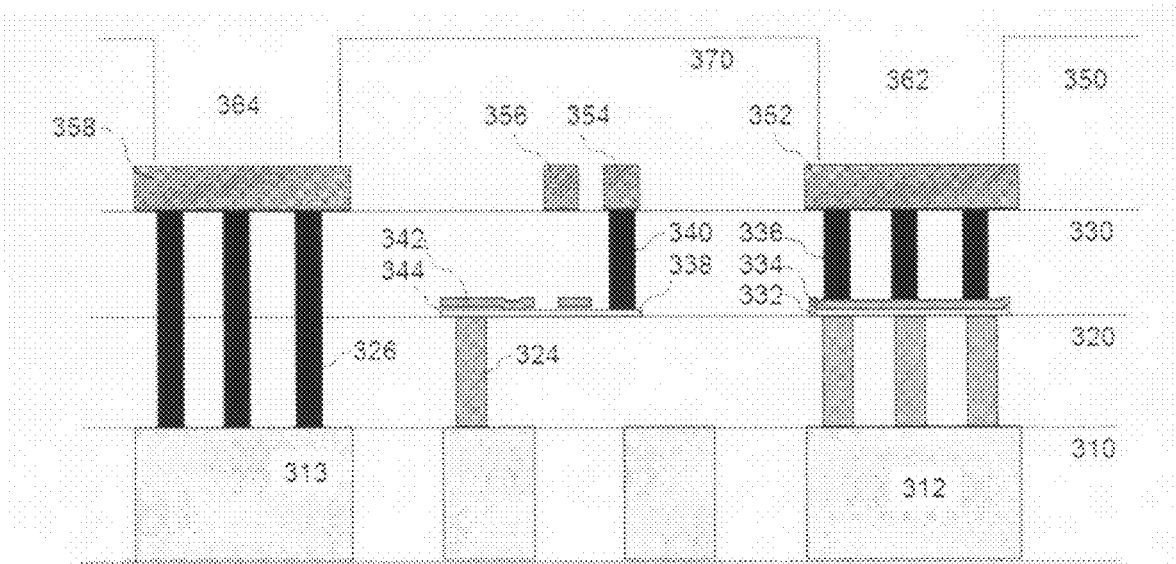
FIG. 8 shows an exemplary cross-sectional view of a multi-ported memory cell.

FIG. 8 shows an exemplary construction cross-sectional view of a multi-ported memory cell built using thin-film transistors. At the bottom is a passivation layer 310 that has one or more top metal regions 312-313 formed therein. The top metal region 312 or 313 can be aluminum, aluminum copper, copper, or any other suitable metallic materials. The top metal layer may be the top metal of a semiconductor logic process that comprises substrate transistors and one or metal layers not shown in the cross-sectional view. Isolation layer 320, plasma TEOS or any other dielectric, is deposited and polished by CMP. Next, in isolation layer 320, one or more contacts (or vias) 324 are formed and filled with Tungsten or any other suitable conductive fill-material. A first poly layer 332/338 is deposited above isolation layer 320, then patterned and etched. The contacts 324 couple top metal 312 to the first poly 332/338 regions. First poly regions comprise NMOS, PMOS and interconnect regions. These regions are implanted with Vt adjust implants: N-type for NFET, and P-type for PFET to form FD Accumulation mode TFT FET's. In other embodiments, P-type for NMOS and N-type for PMOS may be used to form PD Depletion mode TFT MOSFETs. A gate dielectric 344 is deposited by plasma CVD techniques above the first poly. The gate dielectric is patterned and etched to form buried contacts 334. A second poly 342 is deposited after buried-contact formation and appropriate resist cleaning and surface treatment. At the buried contact locations 334, the second poly shorts to first poly forming a single poly layer. Either one or both poly layers may be amorphous or crystalline. The second poly 342 is masked and appropriately implanted to form gate regions for transistors, and interconnects. In the FET example, P-type implant is used for NMOS and N-type implant is used for PMOS devices. For standard MOS devices, gate doping is performed after the spacer formation. The second poly is masked and etched to form gate regions and interconnect regions. A hard-mask having deposited oxide may be used to etch the second poly. A tip-implant is used to dope Source & Drain regions for the devices. In a FET example, N-type implant is used for NFET and P-type implant is used for PFET devices. This is opposite of MOS device formation. A spacer oxide is deposited and etched to form a spacer. The hard mask may be cleaned and a salicadation process with Nickel or Cobalt is performed to silicide the gate & interconnect regions of poly-2 and source/drain regions of exposed poly-1. The alicidation is not shown in the cross-section of FIG. 8. A plasma dielectric 330 is deposited and polished by CMP. Contacts 336, 340 and 326 are exposed and etched into the dielectric 330. Shallow contacts 336/340 terminate on poly-2/poly-1 respectively, while deep contact 326 terminates on the top metal layer. The deep contacts/vias 326 avoid the resistance and capacitance associated with poly-1/poly-2 pads 332/334 and offer better pad connectivity to underlying circuits. Shallow contacts 324 connect TFT device the signals to top metal 312, which are high impedance nodes, and have little impact on resistance and benefits by parasitic capacitance. In any case, poly-1 and poly-2 stack is silicided to form a low resistance coupling path. The contacts 336, 340 & 326 are filled with Tungsten or a suitable fill-material and polished. A TFT metal layer 352-358 is deposited, patterned and etched above the contacts. These metal lines support electrical connections to thin film transistor (TFT) memory devices that are deposited on layer 320. A passivation layer 370 is deposited above the TFT metal 352-358. A pad etch 362/364 is formed above the metal pad region 352/358. Except for the open pad regions, rest of the active circuit regions is encapsulated by the top passivation layer 370. The exemplary process flow in FIG. 8 for forming the multi-ported memory in accordance with one aspect is summarize as follows:

| Process | Mask Sequence |
| --- | --- |
| 6K TEOS oxide on Silicon | |
| 8.5K Al: Top metal deposition, mask & etch | 1 |
| 8K TEOS & CMP - 6K final over top metal | |
| Top metal via mask & etch | 2 |
| Clean/treatment/300A P1 dep | |
| P1 implants (N & P type), P1 mask & etch | 3,4,5 |
| 200A gate TEOS | |
| Buried contact mask + oxide etch | 6 |
| Clean/treatment/500A P2 dep | |
| P2 implants (P & N type), P2 mask & etch | 4,3,7 |
| N-tip, P-tip implant masks & implant | 3, 4 |
| 4.5K TEOS & CMP (?) - 4K final over P2 | |
| P1/P2 contact mask & etch | 8 |
| TFT metal dep, mask & etch | 9 |
| Passivation & pad mask | 10 |

Figure 9A:
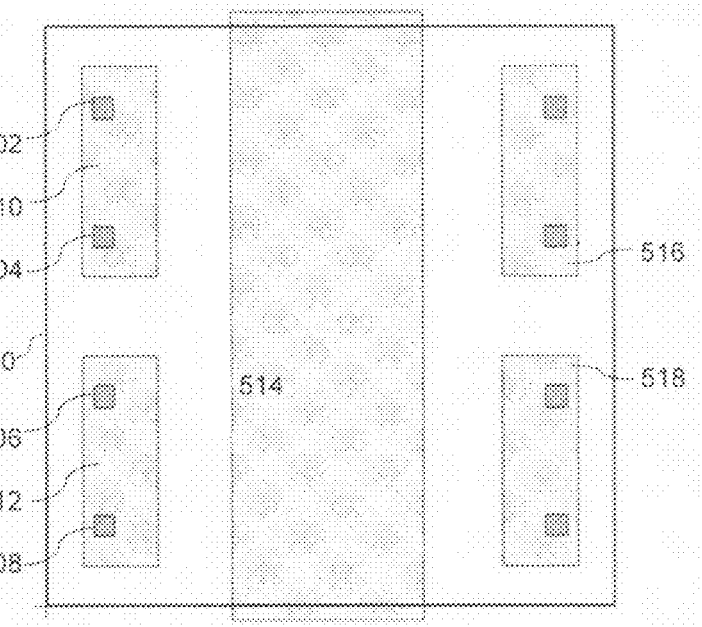
FIG. 9 shows an exemplary memory cell layout.
Figure 9B:
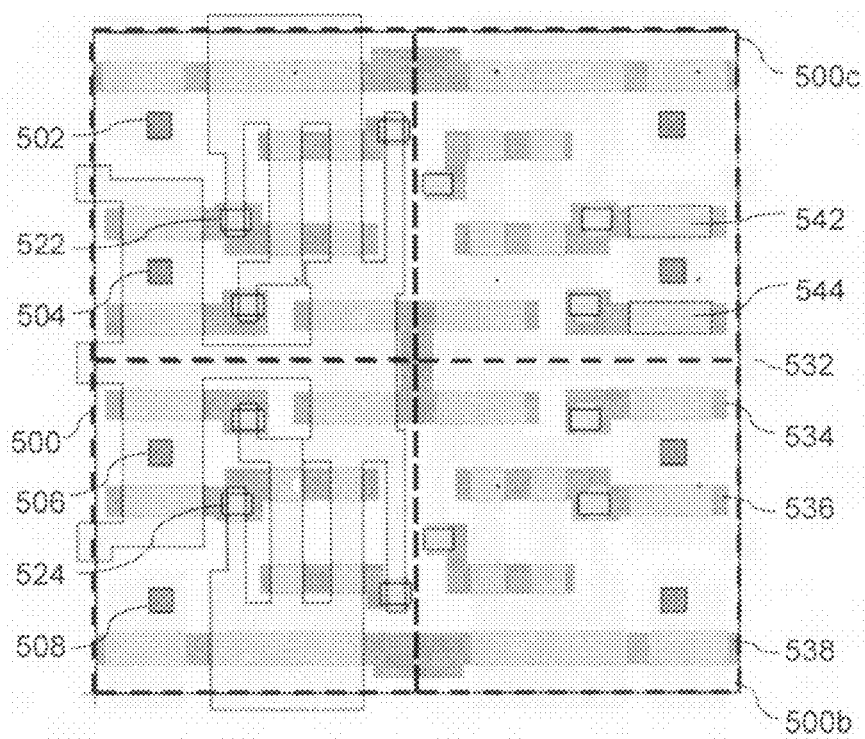
Figure 9C:
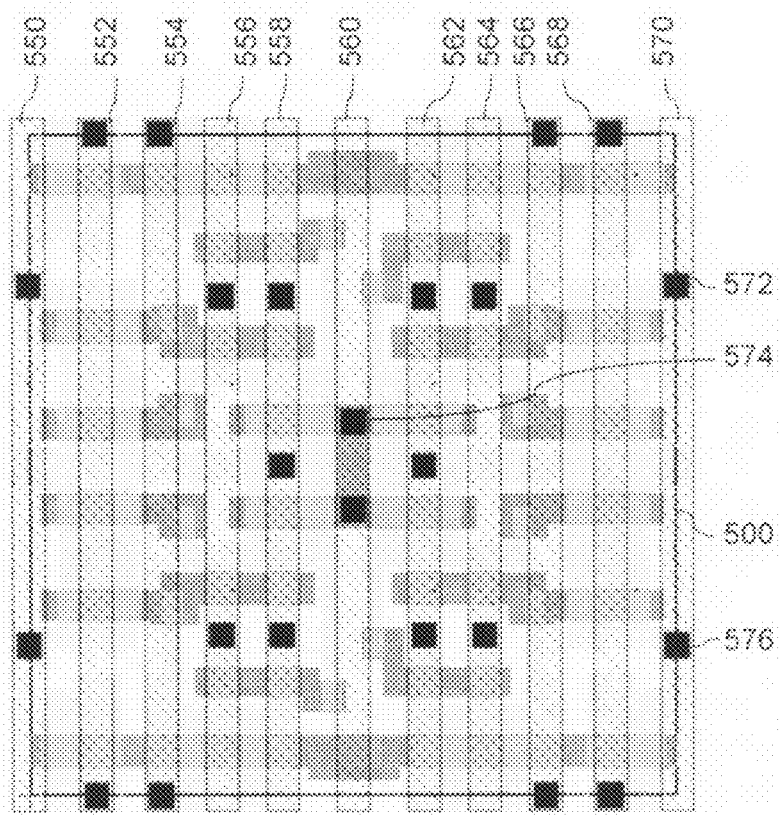

FIG. 9 shows the exemplary memory cell layout shown in FIG. 6 fabricated by the process steps shown in FIG. 8. FIG. 9A shows two mask layers: the metal layer (514) above which the memory cells are constructed, and the contacts (502) that couple the metal to memory cells. Geometry 500 is the boundary of four memory elements that repeats in an array. Geometries 510, 512, 514, 516, 518 are all metal geometries. In an array, metal 514 extends into a long line. Such lines are used for power, ground or global control distribution. Geometries 510, 512, 516 & 518 provide local interconnect for the memory cells, each located in one quadrant of 500, each coupling two nodes within a cell in that quadrant. The coupling occurs thru the contacts 502, 504, 506, 508. FIG. 9B shows four mask layers: contacts to metal (502, 504) shown in FIG. 9A, poly-1 geometries (532), buried contact geometries (522, 524) and poly-2 geometries (534, 536). Each of the four quadrants such as 500b, 500c contains a cell. A buried-contact 524 shorts poly-1 to poly-2 in that geometry overlap regions. Poly-1 and poly-2 overlap regions such as 542, 544 are transistor regions. Each quadrant comprise 9 transistors, the same 9 transistors shown in a cell of FIG. 4c and FIG. 6. Each inverter in FIG. 6 includes two transistors, the transistor type determined by dopant implants. The dopant implants are not shown in the masking layers. Metal 512 and contacts 506, 508 couple the two poly-1 regions that contain the two contacts. Poly-2 geometry 532 forms the word line which is shared by the lower two cells. FIG. 9C shows 4 masking layers: poly-1 & poly-2 shown in FIG. 9B, contacts to poly (572, 574) geometries, cell metal (550, 552, 554, 556, 558, 560, 562, 564, 566, 568, 570) geometries. The metal lines run vertically to carry cell signals. Contact 572 couples a cell metal line to poly-1 geometry. Contact 574 couples a cell metal line to a poly 2 geometry. The four poly-2 geometries coupled to contact 574 forms the common global reset path for the four cells. By comparing FIG. 6 with FIG. 9, one familiar in the art would be able to match all circuit symbols of FIG. 6 with all layout geometries in FIG. 9.

A brief process description of the selectively manufacturing memory is discussed next. During manufacturing, one or more digital circuits can be formed on a substrate. Next, the process selectively fabricates either a memory circuit or a conductive pattern substantially above the digital circuits to control portion of digital circuits. Finally, the process fabricates interconnects and routing layers substantially above the digital circuits and above or below memory circuits to connect digital circuits and one of the memory circuit or the conductive pattern.

Figure 10:
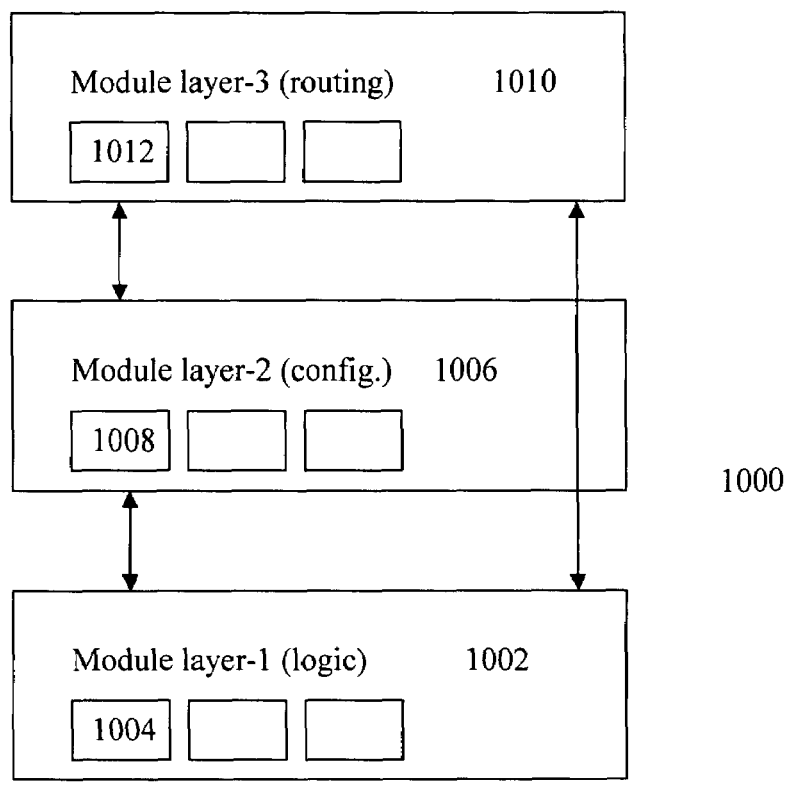
FIG. 10 shows a cross sectional view of a first embodiment of an integrated circuit.

The multi-ported memory devices described above can be used as an FPGA or an ASIC device. FIG. 10 shows a cross sectional view of a first embodiment of an integrated circuit that can be selectably fabricated as either an FPGA or an ASIC. In this embodiment, a three-dimensional semiconductor device 1000 is shown. The device 1000 includes a first module layer 1002 having a plurality of circuit blocks 1004 embedded therein. The device 1000 also includes a second module layer 106 formed substantially above the first module layer 1002. One or more configuration circuits 1008 are formed to store instructions to control a portion of the circuit blocks 1004. In the embodiment of FIG. 10, wiring/routing circuits 1012 are formed on a third layer 1010 above the second layer 1006. Circuits 1012 connect to both circuits 1004 and 1008 to complete the functionality of the PLD. Such a construction offers a plurality of module 1006 configurations without altering modules 1002 and 1010.

Figure 11:
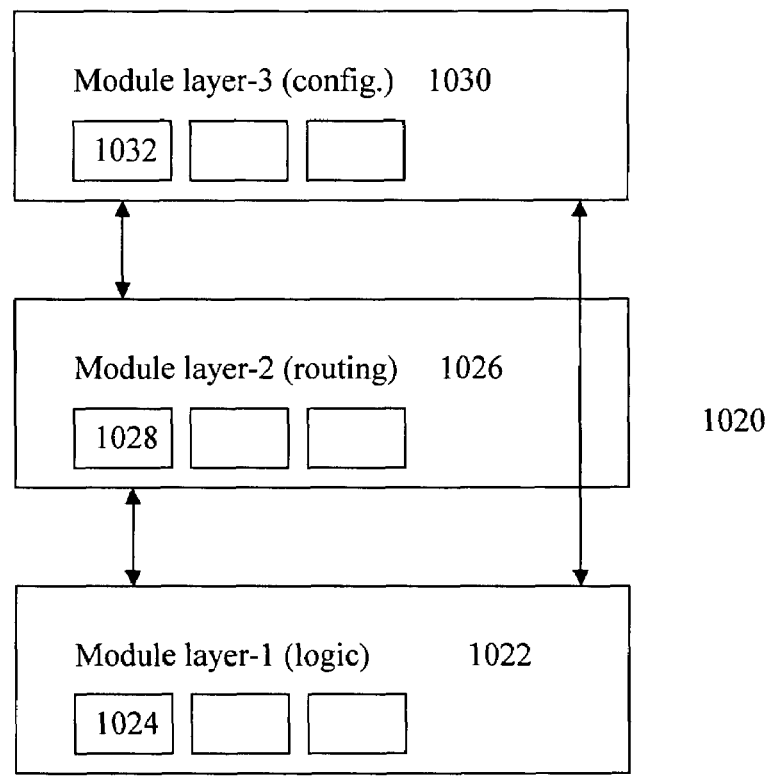
FIG. 11 shows a cross sectional view of a second embodiment of an integrated circuit.

FIG. 11 shows a cross sectional view of a second embodiment of an integrated circuit that can be selectably fabricated as either an FPGA or an ASIC. In this embodiment, a three-dimensional semiconductor device 1020 is shown. The device 1020 includes a first module layer 1022 having a plurality of circuit blocks 1024 embedded therein. The device 1020 also includes a second module layer 1026 formed substantially above the first module layer 1022 that includes wiring and/or routing circuitry 1028, and a third module layer 1030 formed substantially above the second module layer 1026 that includes configuration circuits 1032. The wiring/routing circuitry 1028 is electrically connected to the circuit blocks 1024 and to configuration circuits 1032 in the third module layer 1030. The configuration circuits 1032 store instructions to control a portion of the circuit blocks 1024. Such a construction offers a plurality of module 1030 configurations without altering modules 1022 and 1026.

Figure 12:
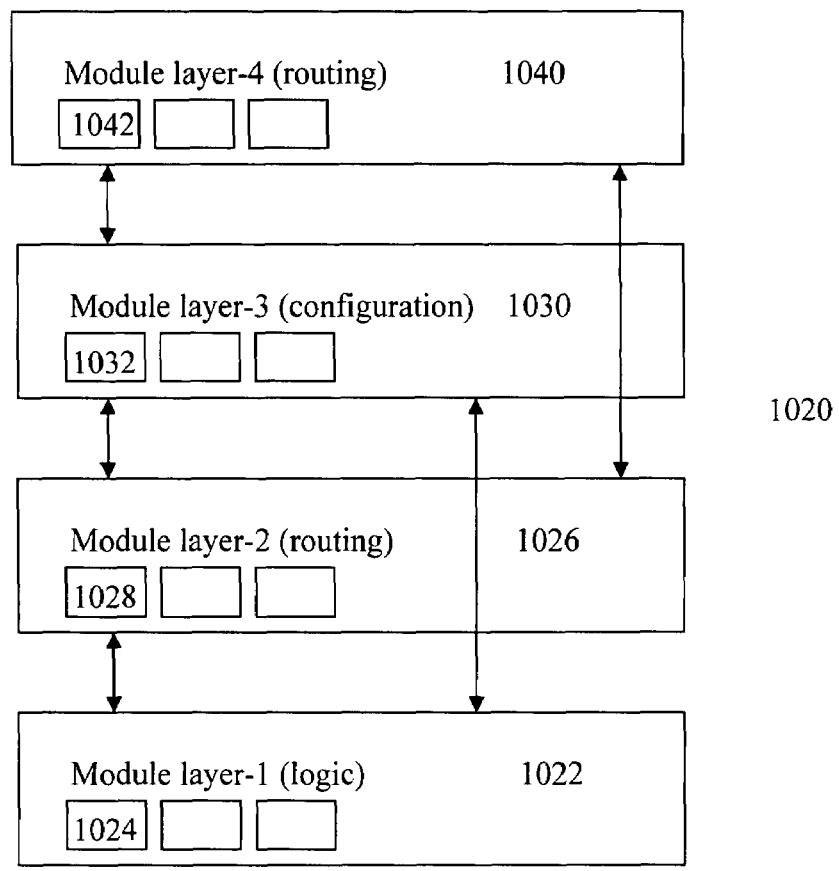
FIG. 12 shows a cross sectional view of a third embodiment of an integrated circuit.

FIG. 12 shows a third embodiment which is substantially similar to the embodiment of FIG. 11. In the embodiment of FIG. 12, a fourth layer 1040 having wiring/routing circuitry 1042 is position above the third layer 1030. The wiring/routing circuitry 1042 is electrically connected to one of the following: one or more circuit blocks 1024, one or more wiring/routing circuitry 1028, and one or more configuration circuits 1032.

Figure 13:
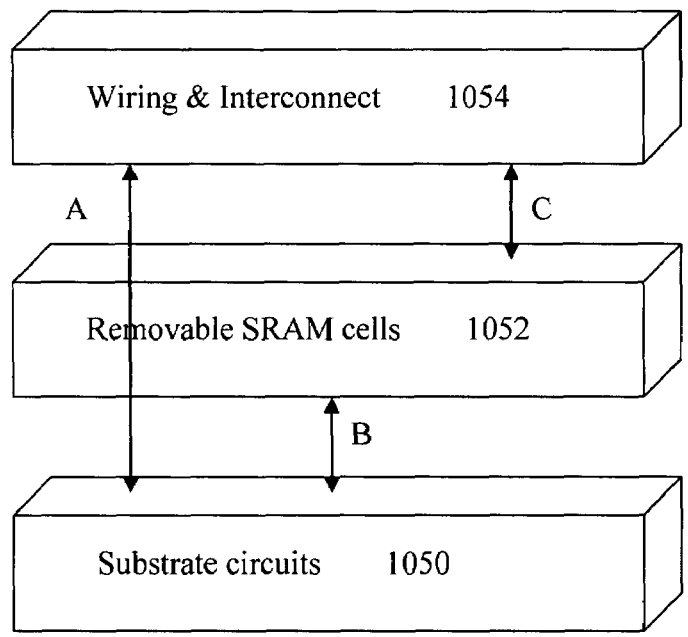
FIG. 13 shows a cross sectional view of a fourth embodiment of an integrated circuit.

FIG. 13 shows one implementation where the configuration memory element is SRAM. First, silicon transistors 1050 are deposited on a substrate. A module layer of removable SRAM memory cells 1052 are positioned above the silicon transistors 1050, and a module layer of interconnect wiring or routing circuit 1054 is formed above the removable memory cells 1052. To allow this replacement, the design adheres to a hierarchical layout structure. As shown in FIG. 13, the SRAM cell module is sandwiched between the single crystal device layers below and the metal layers above electrically connecting to both. It also provides through connections "A" for the lower device layers to upper metal layers. The SRAM module contains no switching electrical signal routing inside the module. All such routing is in the layers above and below. Most of the programmable element configuration signals run inside the module. Upper layer connections to SRAM module "C" are minimized to Power, Ground and high drive data wires. Connections "B" between SRAM module and single crystal module only contain logic level signals and replaced later by Vcc and Vss wires. Most of the replaceable programmable elements and its configuration wiring is in the "replaceable module" while all the devices and wiring for the end ASIC is outside the "replaceable module". In other embodiments, the replaceable module could exist between two metal layers or as the top most layer satisfying the same device and routing constraints.

Fabrication of the IC also follows a modularized device formation. Formation of transistors 1050 and routing 1054 is by utilizing a standard logic process flow used in the ASIC fabrication. Extra processing steps used for memory element 1502 formation are inserted into the logic flow after circuit layer 1050 is constructed. A full disclosure of the vertical integration of the TFT module using extra masks and extra processing is in the issued patents incorporated by reference applications discussed above.

During the customization, the base die and the data in those remaining mask layers do not change making the logistics associated with chip manufacture simple. Removal of the SRAM module provides a low cost standard logic process for the final ASIC construction with the added benefit of a smaller die size. The design timing is unaffected by this migration as lateral metal routing and silicon transistors are untouched. Software verification and the original FPGA design methodology provide a guaranteed final ASIC solution to the user.

The process can be modified to fabricate a generic field programmable gate array (FPGA) with the constructed memory circuit or an application specific integrated circuit (ASIC) with the constructed conductive pattern. Multiple ASICs can be fabricated with different variations of conductive patterns. The memory circuit and the conductive pattern have one or more substantially matching circuit characteristics. In this case, timing characteristics substantially unchanged by the circuit control option. The process thus fabricates a programmable logic device by constructing digital circuits on a substrate; and constructing a non-planar circuit on the substrate after constructing the digital circuits, the non-planar circuit being either a memory deposited to store data to configure the digital circuits to form a field programmable gate array (FPGA) or a conductive pattern deposited to hard-wire the digital circuits to form an application specific integrated circuit (ASIC), wherein the deposited memory and the conductive pattern have substantially matching timing characteristics. In another embodiment, the hard-wire ASIC option may be incorporated into the digital circuit layer 1002. In another embodiment, the hard-wire ASIC option is incorporated into the routing layer 1010.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A semiconductor storage device, comprising:
    a storage element to store a data state coupled to ground and a first supply voltage;
    an isolation circuit coupled to the storage element comprising an output derived by the stored data state, the isolation circuit further coupled to ground and a second supply voltage lower than the first supply voltage;
    a first access device coupled to the storage element and further coupled to a first access circuit to read or alter the stored data state at ground or the first supply voltage;
    a second access device coupled to the output and further coupled to a second access circuit to read the output state at ground or the second supply voltage, wherein the isolation circuit prevents the second access circuit from altering the stored data state.

2. The device of claim 1, wherein the storage element comprises one or more elements selected from the following: diode, transistor, resistor, capacitor, thin film diode, thin film resistor, thin film capacitor, thin film transistor (TFT).

3. The device of claim 1, wherein the latch state can be altered using the first access device and the first access circuit, and the altered state can be verified using the second access device and the second access circuit concurrently.

4. The device of claim 1, wherein the storage element is selected from the group consisting of volatile or non volatile storage elements.

5. The device of claim 1, wherein the storage element is selected from a group of fuse links, latches, antifuse capacitors, SRAM cells, DRAM cells, metal optional links, EPROM cells, EEPROM cells, flash cells, resistance modulating elements, optical elements, charge storage element, Carbon nano-tubes, voltage modulating element, and ferro-electric elements.

6. The device of claim 1, wherein the isolation circuit further comprises one or more elements selected from the following: diode, transistor, resistor, capacitor, thin film diode, thin film resistor, thin film capacitor, and thin film transistor (TFT).

7. The device of claim 1, wherein the isolation circuit further comprises one or more of: inverters, buffers, voltage converters, capacitors, resistors, and transistors.

8. The device of claim 1, wherein the isolation circuit is further coupled to a power supply voltage and a ground supply voltage, and wherein the output is driven to said power or ground supply voltage by the stored data state.

9. The device of claim 1, wherein the output is further coupled to a programmable logic circuit.

10. The device of claim 9, wherein the programmable logic circuit comprises one or more of: pass gate logic, multiplexer logic, truth table logic, look up table logic, AND logic, NAND logic OR logic, NOR logic, arithmetic logic, carry logic, floating point logic, and any other logic.

11. A three-dimensional semiconductor device, comprising:
    a latch to store a data state coupled to a first supply voltage; and
    an isolation circuit coupled to the latch and further coupled to a second supply voltage; and
    an access device coupled to the isolation circuit and further coupled to an evaluation circuit, wherein the latch data is fully isolated from the evaluation circuit during one mode of operation, and wherein the latch operates at the first supply voltage and the evaluation circuit operates at the second supply voltage lower than the first supply voltage.

12. The device of claim 11, wherein the isolation circuit comprises:
   an input coupled to the latch; and
   an output coupled to the access device, said output generated by the input, the input and the output capacitively coupled to prevent the input disturbance from an output probe.

13. The device of claim 12, wherein the isolation circuit comprises one of: buffer circuit, voltage modulation circuit, capacitor circuit, floating-gate circuit, inverter circuit, transistor circuit, thin-film transistor circuit, diode circuit and thin-film diode circuit.

14. The device of claim 12, wherein the output is coupled to a programmable logic element to program the logic element by altering the data state in the latch.

15. The device of claim 11, comprising a second access device coupled to the latch and further coupled to a second evaluation circuit, wherein the latch data can be altered by a second evaluation circuit bias condition.

16. The device of claim 11, wherein the latch comprises a volatile or non volatile memory element.

17. The device of claim 16, wherein the memory element is selected from a group of: fuse links, latches, antifuse capacitors, SRAM cells, DRAM cells, metal optional links, EPROM cells, EEPROM cells, flash cells, resistance modulating elements, optical elements, charge storage element, Carbon nano-tubes, voltage modulating element, and ferroelectric elements.

18. The device of claim 14, wherein the logic element comprises one or more of: pass gate logic, multiplexer logic, truth table logic, look up table logic, AND logic, NAND logic OR logic, NOR logic, arithmetic logic, carry logic, floating point logic, and any other logic.

19. A semiconductor storage device, comprising:
   a first port to write data to a storage element at ground or first voltage levels; and
   a second port to read a signal at ground or second voltage levels generated by the storage element, wherein reading the generated signal protects data stored by the storage element from a read condition disturbance, and wherein the second voltage level is lower than the first voltage level.

20. The device of claim 19, the signal generated by the storage element is coupled to a programmable logic element to configure the programmable logic element.

* * * * *